US006485892B1

(12) United States Patent
Blumberg et al.

(10) Patent No.: US 6,485,892 B1
(45) Date of Patent: Nov. 26, 2002

(54) METHOD FOR MASKING A HOLE IN A SUBSTRATE DURING PLATING

(75) Inventors: Lawrence Robert Blumberg, Johnson City, NY (US); Norman A. Card, Jr., Lockwood, NY (US); Richard Allen Day, Whitney Point, NY (US); Stephen J. Fuerniss, deceased, late of Endicott, NY (US), by Joan Cangelosi, executor; John Joseph Konrad, Endicott, NY (US); Jeffrey McKeveny, Endicott, NY (US); Timothy L. Wells, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/465,593

(22) Filed: Dec. 17, 1999

(51) Int. Cl.[7] .............................. G03C 5/56; G03C 5/00

(52) U.S. Cl. ....................... 430/313; 430/315; 430/311; 430/322; 427/96

(58) Field of Search ......................... 430/311–313, 315, 430/322; 427/96

(56) References Cited

U.S. PATENT DOCUMENTS 3,873,756 A 3/1975 Gall et al. ................. 174/68.5
3,934,335 A * 1/1976 Nelson ....................... 430/313
4,293,624 A * 10/1981 Buckley ..................... 430/315
4,566,180 A 1/1986 Witwer et al. ................ 29/596
4,911,796 A 3/1990 Reed ........................... 204/15
5,028,743 A 7/1991 Kawakami et al. ......... 174/264
5,047,262 A 9/1991 deVries et al. ................ 427/96
5,079,065 A * 1/1992 Masakazu et al. ............ 427/96
5,102,970 A 4/1992 Wang .......................... 528/98
5,208,068 A 5/1993 Davis et al. .................. 427/97
5,268,260 A * 12/1993 Bantu et al. ................ 430/311
5,292,861 A 3/1994 Papathomas ................ 528/422
5,319,159 A 6/1994 Watanabe et al. ........... 174/262
5,356,755 A 10/1994 Matsuda et al. ............ 430/313
5,422,184 A 6/1995 Papathomas et al. .... 428/411.1
5,487,218 A 1/1996 Bhatt et al. ................... 29/852
5,523,383 A 6/1996 Ikeda et al. ................. 528/345
5,557,844 A 9/1996 Bhatt et al. ................... 29/852
5,633,072 A 5/1997 Middelman et al. ........ 428/209

FOREIGN PATENT DOCUMENTS

JP 5-218641 * 8/1993

* cited by examiner

*Primary Examiner*—Mark F. Huff
*Assistant Examiner*—Daborah Chacko Davis
(74) *Attorney, Agent, or Firm*—Connolly Bove Lodge & Hutz; Lawrence R. Fraley

(57) ABSTRACT

Through-holes in a substrate are masked during plating of the substrate by substantially filling the through-holes with a liquid material, followed by applying a photoimageable material to an external surface of the substrate, forming a predetermined pattern in the photoimageable material, circuitizing the predetermined pattern and then removing both the photoimageable material and the liquid material from the through-holes.

13 Claims, No Drawings

METHOD FOR MASKING A HOLE IN A SUBSTRATE DURING PLATING

TECHNICAL FIELD

The present invention relates to fabricating a circuitized substrate having through-holes. More particularly, the present invention relates to a method for masking through-holes in a substrate during the circuitization or plating of the substrate.

BACKGROUND OF INVENTION

In the manufacture of printed circuit boards and cards, a dielectric sheet material is employed as the substrate. A conductive circuit pattern is provided on one or both of the major surfaces on the substrate. Generally speaking, high density printed circuit boards are constructed with several electrically conductive layers separated by dielectric layers. The dielectric layers typically contain through-holes for the purpose of making interconnections between electrically conductive layers. The holes are plated with an electrically conductive material such as copper.

When selectively plating the dielectric substrate to provide the circuitization, a plating resist is provided on the substrate to protect those areas which are not to be plated at this stage of the process and which typically includes the already plated through-holes. Accordingly, it necessary to tent the holes with the resist material during the circuitization.

However, various plating compositions cause certain problems in this regard. By way of example, electroless plating of gold usually involves relatively caustic compositions (high pH) and plating conditions employing relatively high temperatures. Due to the caustic nature of typical electroless gold plating chemistry, the available plating resists capable of withstanding such conditions are rather limited. Those resists of choice although quite capable of withstanding the plating conditions, do not exhibit especially good tenting capability and especially tenting characteristics needed to tent relatively large holes (>30 mils) that are generally present on multilayer circuit boards. Accordingly, using such creates a risk of broken tents over the holes. This in turn results in subsequent plating of relatively thick electroless gold in the plated through-holes. The presence of such gold in the placed through-holes represents a significant reliability concern since the gold is capable of interacting with solder employed in subsequent assembly processing. This in turn can create an intermetallic which would thereby weaken the reliability of the solder joint.

Accordingly, it would be desirable to provide a process that makes it possible to circuitize a substrate having at least one hole therein and to tent the hole successfully regardless of the plating conditions and plating resist employed.

SUMMARY OF INVENTION

The present invention provides a process which makes it possible to successfully tent holes on a substrate during the circuitization of the substrate even when using plating resist compositions that do not exhibit very good tenting characteristics such as the available resists for electroless gold plating. More particularly, the present invention provides a method for masking a hole in a substrate during plating of the substrate by providing a substrate with first and second external surfaces and having at least one hole extending substantially through the substrate and then subsequently filling the at least one hole with a liquid material. A photoimageable material is then applied to at least one of the external surfaces of the substrate followed by forming a predetermined pattern in the photoimageable material and then circuitizing the predetermined pattern by plating a conductive metal onto the substrate. The photoimageable material is then removed from the at least one external surface of the substrate followed by removal of the liquid material from the at least one hole in the substrate.

The presence of the filled holes provide a base for the photoimageable material to adhere to over the holes of the substrate thereby eliminating the risk of broken tents.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The present invention provides a method for masking a hole in a substrate during plating or circuitization of the substrate. The process of the present invention is applicable to a wide variety of dielectric (non-conductive) substrates. Dielectric substrates described in the prior art, including thermoplasting and thermosetting resins, may be plated in accordance with the present invention.

Typical thermosetting polymeric materials include epoxy, phenolic base materials, and polyamides. The dielectric materials may be molded articles of the polymers containing fillers and/or reinforcing agents, such as glass-filled epoxy or phenolic base materials. Examples of some phenolic type materials include copolymers of phenol, resorcinol and cresol. Examples of some suitable thermoplastic polymeric materials include polyolefins, such as polypropylene, polysulfones, polycarbonates, nitrile rubbers, ABS polymers and fluorinated polymeric materials such as polytetrafluoroethylene.

The substrates have two major external surfaces and have at least one hole that extends substantially through the substrate. The holes are referred to as through-holes and can be drilled through the substrate such as by using a laser beam. Holes, where desired, can be plated with a conductive material such as copper in order to provide interconnection between layers. The plating of the holes can be carried out by any of the methods known in the art and need not be described herein in any great detail.

According to the present invention, plated through-holes are selectively filled with a liquid material. The holes are filled by providing a removable patterned screen on the substrate which blocks material from the substrate except for flowing into the through-holes. This screen hole fill process can be performed on an industry standard screen printer such as an Argon Model Hydra-2. The composition is typically a flowable solder mask or epoxy composition and is preferably photoimageable. Examples of some specific compositions employed include Taiyo PSR 4000 AC. In addition, if desired the holes can be filled by providing the composition on a film carrier with the composition facing the plated through-holes being placed on the substrate and then vacuum laminating the film carrier and substrate together which in turn causes the composition to flow into the plated through-holes. After this, the carrier is removed leaving the through-holes filled with the composition.

A photoimageable resist composition is then applied to the substrate. Examples of some resist materials employed, according to the present invention, include photohardenable polymerizable compositions of the type suggested in U.S. Pat. Nos. 3,469,982, 3,526,504, 3,867,153 and 3,448,098, and published European Patent Application 0 049 504, disclosures of which are incorporated herein by reference. Polymers from methylmethacrylate and from glycidyl acrylate and/or from a polyacrylate such as trimethylol propane triacrylate and pentaerythrithol triacrylate are commercially available from E.I. DuPont Demours and Company under the trade designation "Riston".

Examples of some particular photohardenable resists employed according to the present invention are from polymethylmethacrylates such as those commercially available under the trade designations "Riston 3120", "Riston T-168" and "Riston 3515". Riston T-168 is a photohardenable resist material from polymethylmethacrylate and cross-linkable monomeric units, such as from trimethylol propane triacrylate. A detailed discussion of preparing a resist from polymethylmethacrylate, trimethylol propane triacrylate and trimethylene glycol diacetate can be found in Example 1 of U.S. Pat. No. 3,867,153. Riston 3120 is an acrylate-based resist material containing carboxylic groups and is developable in an aqueous medium.

The resist is typically applied to a thickness of about 0.6 mils to about 3 mils.

The layer of resist is then selectively exposed to the desired pattern and images by a known technique, such as ultraviolet light, electron beam or x-ray beam technique, followed by removal of the unexposed portions in the case of photohardenable resist materials such as by etching or dissolution in an appropriate liquid.

Suitable solvents for Riston T-168 include butyrolactone, propylene carbonate and butyl alcohol. The resist is developed to provide the desired circuit pattern.

The filled holes provide a base for the resist material to adhere to over the plated through-holes, thus eliminating the risk of broken tents.

The substrate can then be catalyzed or seeded to render it active for subsequent electroless plating.

The circuitry can then be provided by plating from an electroless plating bath such as a gold electroless plating bath, electroless nickel plating bath or electroless copper plating bath or an immersion gold plating composition. Examples of some baths and conditions for plating are as follows:

Electroless Nickel (Mid P)
- pH—4.8–5.3
- Temp—75–85° C.

Electroless Gold (Pure)
- pH—12–13
- Reducer—2–10 g/l
- Temp—55–70° C.
- Gold (Au) 1.5–2.5 g/l Immersion Gold
- pH—4.0–6.0
- Temp—75–85° C.
- Gold (Au) 1.5–2.0 g/l The present invention is especially advantageous for plating of gold because of the highly caustic nature of the electroless gold plating which involves relatively high temperatures of about 55° C. to about 70° C. and relatively high pH conditions of about 12.0 to about 13.0.

After the plating or circuitization, the plating mask or resist is removed which in the case of T-168 involves temperatures of about 85 to about 105° C. along with an organic solvent such as $PCO_3$. The stripping can be achieved by high pressure spraying of the organic solvent such as using about 2.5 to about 5.0 BAR of pressure. This also results in removal or stripping of the fill material from the holes.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for masking a hole in a substrate during plating of the substrate which comprises:

providing a substrate with first and second external surfaces and having at least one hole extending substantially through the substrate;

substantially filling the at least one hole with a liquid material to facilitate tenting over of the at least one hole with subsequently to be applied photoimageable material;

applying a photoimageable material to at least one external surface of the substrate;

forming a predetermined pattern in the photoimageable material;

circuitizing the predetermined pattern;

removing the photoimageable material from the at least one external surface; and removing the liquid material from the at least one hole.

2. The method of claim 1 wherein the at least one hole is greater than 30 mils in diameter.

3. The method of claim 1 wherein the liquid material comprises a solder mask or epoxy material.

4. The method of claim 1 wherein the liquid material is selectively screened into the at least one hole.

5. The method of claim 1 wherein the liquid material is provided in the at least one hole by providing the liquid material on a film carrier, placing the liquid material facing the at least one hole on the substrate and vacuum laminating the carrier and substrate, and then removing the carrier.

6. The method of claim 1 wherein the circuitizing comprises plating from an electroless gold plating bath.

7. The method of claim 6 wherein the photoimageable material comprises a copolymer from polymethylmethacrylate and a cross-linkable monomer.

8. The method of claim 1 wherein the photoimageable material comprises a copolymer from polymethylmethacrylate and a cross-linkable monomer.

9. The method of claim 1 wherein the photoimageable material and liquid material are removed by employing an organic solvent sprayed at a pressure of about 2.5 to about 5 BAR.

10. The method of claim 9 wherein the organic solvent is at a temperature of about 85 to 105° C. during the spraying.

11. The method of claim 10 wherein the organic solvent comprises $PCO_3$.

12. The method of claim 1 which comprises plating at least one hole prior to substantially filling the at least one hole with a liquid material.

13. The method of claim 1 wherein said at least one hole is filled with said liquid material.

* * * * *